United States Patent

Keller et al.

[11] 4,035,600
[45] July 12, 1977

[54] APPARATUS FOR CRUCIBLE-FREE ZONE PROCESSING OF A SEMICONDUCTOR ROD

[75] Inventors: Wolfgang Keller, Munich; Hans Stut, Grobenzell, both of Germany

[73] Assignee: Siemens Aktiengesellschaft, Berlin & Munich, Germany

[21] Appl. No.: 596,519

[22] Filed: July 16, 1975

[30] Foreign Application Priority Data

July 16, 1974 Germany .................... 2434136

[51] Int. Cl.² ............................................. H05B 5/02
[52] U.S. Cl. ........................... 219/10.57; 219/10.43
[58] Field of Search ......... 219/10.41, 10.43, 10.57; 317/243; 13/1

[56] References Cited

U.S. PATENT DOCUMENTS

| | | | |
|---|---|---|---|
| 2,159,826 | 5/1939 | Thacker | 317/243 X |
| 3,219,892 | 11/1965 | Wurster | 317/243 |
| 3,271,551 | 9/1966 | Keller | 219/10.41 |
| 3,827,017 | 7/1974 | Keller | 219/10.43 X |

FOREIGN PATENT DOCUMENTS

| | | | |
|---|---|---|---|
| 1,137,804 | 10/1962 | Germany | 317/243 |
| 749,438 | 5/1956 | United Kingdom | 317/243 |

OTHER PUBLICATIONS

Birks, "Modern Dilectric Material", Heywood & Co., London, 1960, p. 165.

Primary Examiner—E. A. Goldberg
Attorney, Agent, or Firm—Hill, Gross, Simpson, Van Santen, Steadman, Chiara & Simpson

[57] ABSTRACT

An apparatus for a floating zone melt processing of a semiconductor rod including a heating circuit comprised of an annular induction heating coil adapted to annularly encompass a zone of the semiconductor rod and upon activation to produce an annular melt zone on such rod, a plurality of ceramic capacitors positioned within a fluid-impermeable housing filled with a low viscosity dielectric cooling fluid, such as a transformer oil, and connected in parallel with the heating coil and hollow electric current conduits coupling the heating coil and the capacitors to the output circuit of a high frequency generator and to a hydraulic heat-exchange circuit.

3 Claims, 3 Drawing Figures

APPARATUS FOR CRUCIBLE-FREE ZONE PROCESSING OF A SEMICONDUCTOR ROD

BACKGROUND OF THE INVENTION

1. Field of the Invention

The invention relates to an apparatus for crucible-free zone melting of a semiconductor rod including an annular induction heating cole adapted to annularly encompass a zone of the rod and upon activation to produce an annular melt zone on such rod and somewhat more particularly to such an apparatus wherein the heating coil is parallelly connected to a capacitance and electrical current conduits couple the coil and the capacitance to the output circuit of a high frequency generator.

2. Prior Art

U.S. Pat. No. 3,271,551 (which corresponds to German Pat. No. 1,198,324) describes an apparatus for crucible-free zone melting of a semiconductor rod which has a heating circuit comprised of an annular induction heating coil adapted to annularly encompass the semiconductor rod and upon activation to produce an annular melt zone on such rod and a parallelly connected capacitance which is coupled via electric current conduits to an output circuit of a high frequency generator.

In this type of device, the tuning capacitors for the required capacitance are in the form of Teflon (a registered trademark for polytetrafluoroethylene) capacitors. These Teflon capacitors are positioned directly at the location of the induction heating coil in the zone melting chamber of a gas-impermeable (vacuum-tight) housing. However, at high HF power, such as required for non-crucible zone melting of silicon rods having an increased diameter, for example, greater than 50 mm, the utility of such capacitors is limited since they become extremely subject ot disturbances or destruction.

SUMMARY OF THE INVENTION

The invention provides a relatively economical and reliably operating apparatus for crucible-free zone melting of a semiconductor rod which includes a heating circuit comprised of an annular induction heating coil of the type noted above and a parallelly connected capacitance coupled to the outlet circuit of a high frequency generator arranged so that such heating circuit avoids the aforesaid prior art drawbacks.

In accordance with the principles of the invention, the capacitance is formed by a plurality of parallelly connected ceramic capacitors positioned within a fluid-impermeable (vacuum-tight) housing filled with a low viscosity dielectric cooling fluid and the electric current conduits between the heating coil and such capacitors comprise hollow tubes so that such tubes simultaneously carry a desired HF current to the heating coil and carry a desired heat-exchange fluid, such as water, past the capacitors so as to cool them.

In a preferred embodiment of the invention, the heating coil is provided with fluid passages therein which are serially interconnected to the heat-exchange fluid conduits about the capacitors so that the heatexchange fluid simultaneously cools the capacitors and the heating coil. In one form of this embodiment, the support tube for the capacitor housing is filled with the low viscosity dielectric cooling fluid and is joined with the hydraulic heat-exchange circuit so that such support tube is also cooled along with the heating coil and the capacitors.

In a preferred embodiment of the invention, the low viscosity dielectric cooling fluid within the housing encompassing the ceramic capacitors comprises a transformer oil, such as a halogenated hydrocarbon oil.

In a preferred embodiment of the invention, the ceramic capacitors are parallelly connected to one another via plates composed of a highly electrically conductive material, such as copper or silverplated copper, and such plates are in contact with the conduits for a heat-exchange fluid, such as water, circulating through a hydraulic heat-exchange circuit.

In a preferred embodiment of the invention, the housing encompassing the plurality of ceramic capacitors is positioned within the zone melting chamber in relatively close vicinity to the induction heating coil so that the electrical conduits to the coil through which the resonance current flows are relatively short.

In a preferred embodiment of the invention, each of the ceramic capacitors are surrounded by U-shaped cooling plates, preferably formed of copper, to further amplify the heat-discharge ability of the capacitor. The U-shaped plates are mounted about each capacitor during assembly of the capacitor device.

In a preferred embodiment of the invention, the support tube maintaining the capacitor housing within the zone melting chamber in the desired relation to the induction heating coil is clad with a coating of a highly conductive non-magnetic material, such as copper, in order to avoid eddy current losses.

DESCRIPTION OF THE PREFERRED EMBODIMENTS

Figure 1:
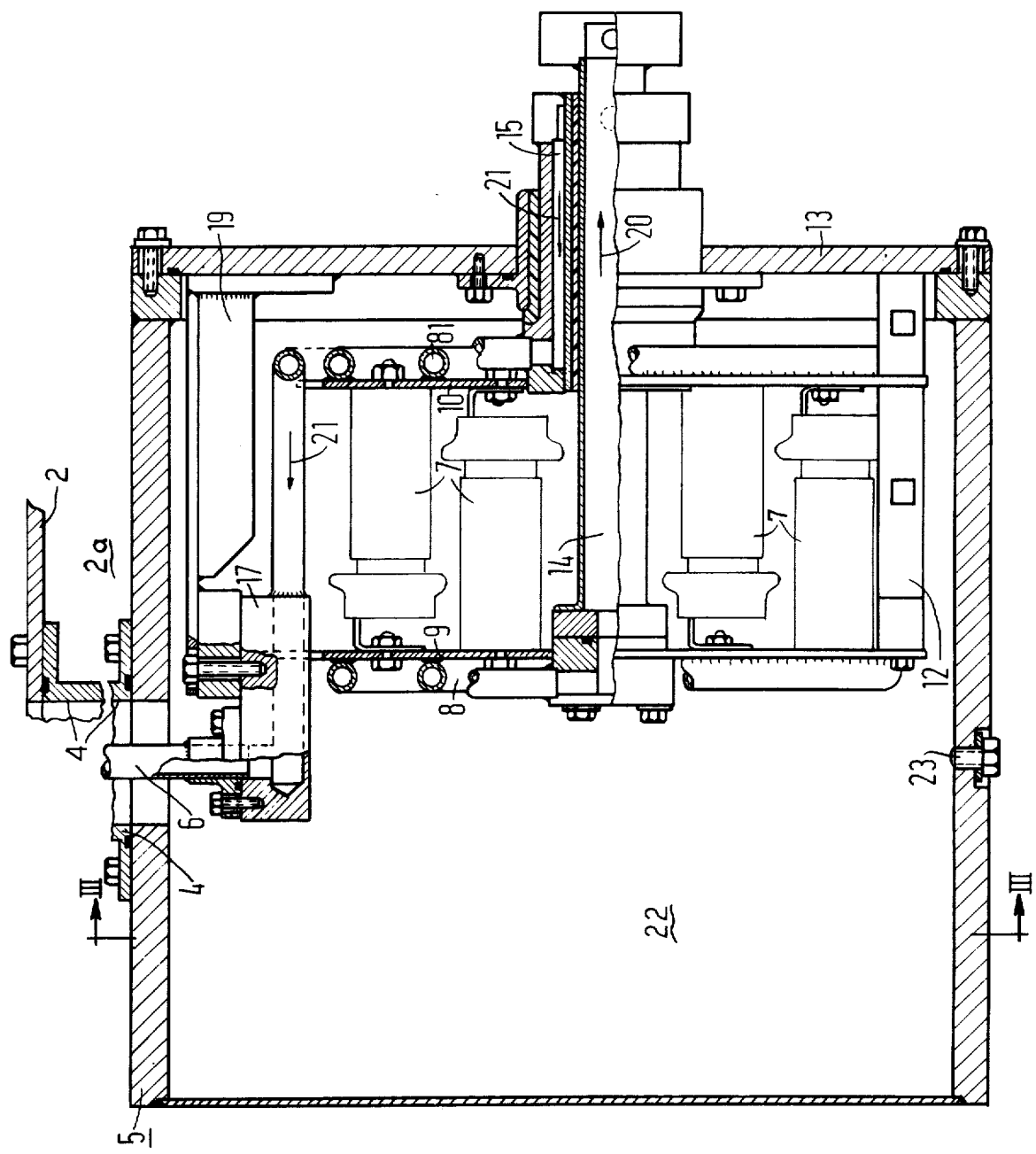
FIG. 1 is an elevated sectional view, partially broken away, illustrating a capacitor device in a heating circuit constructed and operable in accordance with the principles of the invention.

Throughout the various Figures, like reference numerals are utilized for like parts.

A zone melting housing 2 typically includes a gas-impermeable chamber 2a of a sufficient size to accommodate a semiconductor rod being processed therein, appropriate rod support members, and induction heating coil, appropriate power conduits, support means for such various components, gas inlets and outlets, etc., all of which have been omitted for the sake of clarity and will be referred to herein and in the claims as "an operable processing or melting housing".

Figure 2:
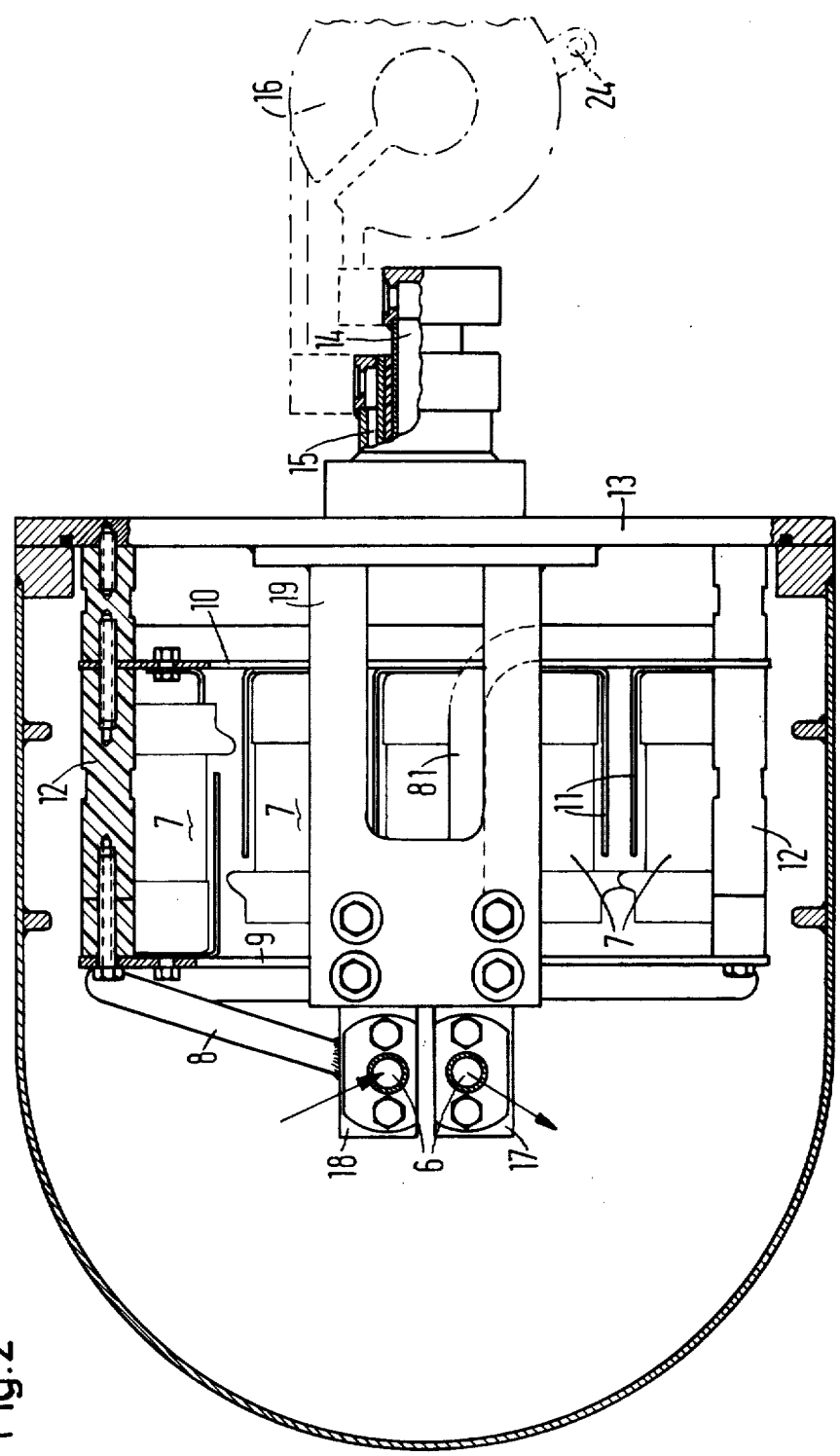
FIG. 2 is an elevated vertical view, again partially broken away, illustrating an open capacitor device in combination with an inducting heating coil (in phantom) useful in the practice of the invention.
Figure 3:
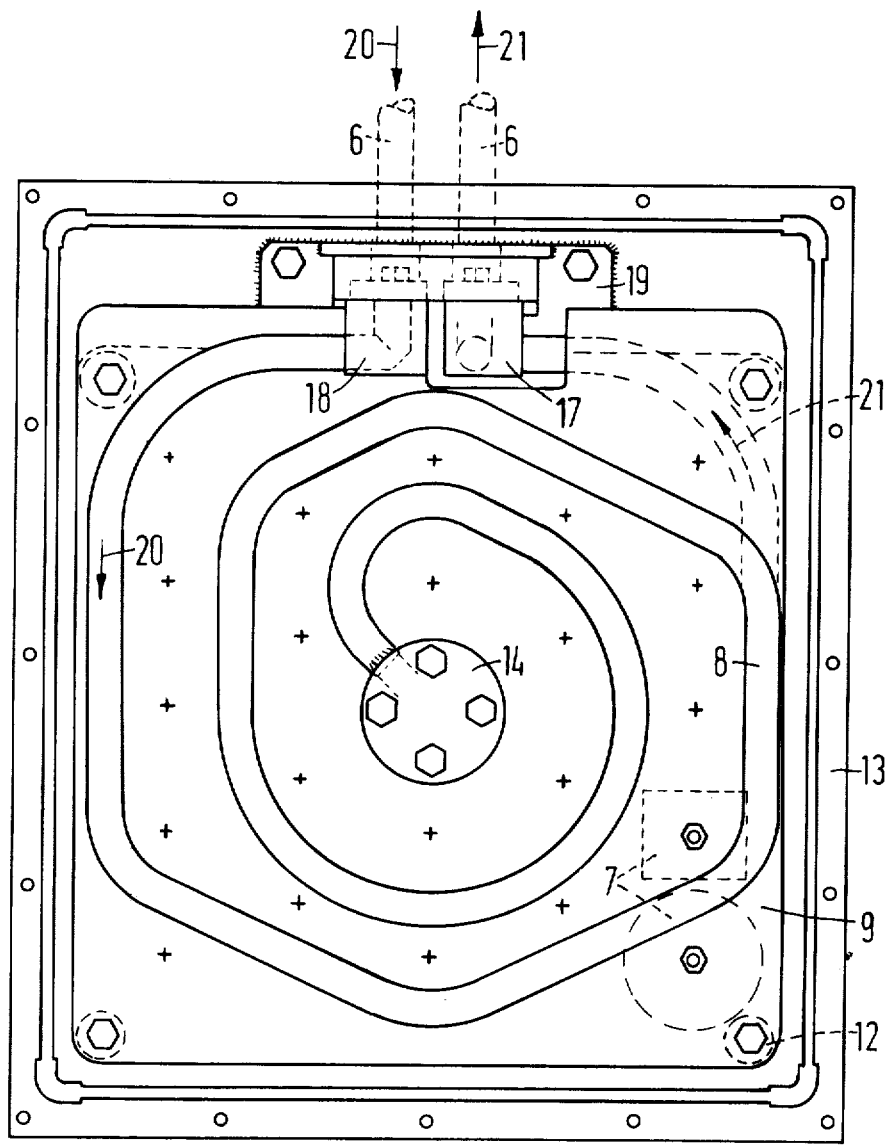
FIG. 3 is an elevated plan view, with some parts in phantom, taken substantially along lines III—III of FIG. 1.

In accordance with the principles of the invention, such an operable 2 includes a hollow support tube 4 which provides access for conduit means 6 into the chamber 2a from outside the housing 2. The support tube 4 is suitably anchored, as by bolts, to a capacitor housing 5 so that the housing 5 can be positioned at a select location within the chamber 2a. The conduit means 6 preferably comprise hollow tubes so as to accommodate a heat-exchange fluid, such as water, circulating in the direction of arrows 20 and 21 through a hydraulic circuit which includes cooling coils 8 and 81, respectively, within the capacitor housing 5. A plurality of ceramic capacitors 7 are mounted on electrically conductive support plates 9 and 10, preferably composed of copper, in a parallel manner as shown. In certain embodiments, for example, as shown in FIG. 2, somewhat U-shaped coiling plates 11, preferably composed of copper, may be provided about each capacitor 7 for additional cooling or heat dissipation.

The support plates 9 and 10 between which the capacitors 7 are located, are fixed at intervals to a base plate 13 of the housing 5 via insulating rods 12. The heat-exchange fluid (preferably water) and the HF power conduit coils or tubes 8 and 81 guide the heat-exchange fluid and the electrical current to parallel conductors 14 and 15, respectively. Conductors 14 and 15 may be coaxial and the inner conductor 14 is attached, as by screws, to support plate 9 while the outer conductor 15 is attached, as by hard-soldering, to support plate 10. The conductors 14 and 15 are conventionally passed through the base plate 13 in an insulated and gas-impermeable manner for connection with an induction heating coil. The HF-powered induction heating coil 16 (shown in phantom in FIG. 2) is attached, as by screwing, to the head of the conductors 14 and 15 in a known manner. The HF and heat-exchange fluid conduits 6 are connected via flanges 17 and 18 to the cooling conduits or tubes 8 and 81, respectively. The flanges 17 and 18 are connected to the base plate of housing 5 in an insulated manner via a bearing arm 19 which provides additional support for the ceramic capacitor 7. As indicated earlier, the hydraulic cooling circuit within the hollow conduits 81, 8 and 6 flows in the direction of arrows 20 and 21, with the arrow 20 indicating the out-flow path and the arrow 21 indicating the in-flow path of a heat-exchange fluid, such as water.

The interior 22 of housing 5 is filled with a low viscosity dielectric cooling fluid, for example, a transformer oil (which for the sake of clarity has been omitted from the drawings).

A drain screw 23 may be provided along a wall of housing 5 for removal or addition of, for example, a transformer oil to the capacitor housing 5.

The heating coil 16 may be provided with a ground connection 24 as desired.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

Transformer oils are known to typically comprise halogenated hydrocarbon oils, for example, halogenated aromatic oils such as trichlorodiphenyl commercially available under the registered trademark "PYRANOL-1499" or similar halogenated oils having 1 to 5 halogen (preferably chlorine) substituents from 1 to 3 aryl groups therein. As the art is aware, numerous transformer oils and/or mixtures thereof are known and may comprise a mixture of materials including a transformer oil such as trichlorodiphenyl and/or trichlorobenzene and stabilizer additives or scavengers such as dipentenedioxide, 1-epoxyethyl-3, 4-epoxycyclohexane, allyl gycidyl ethers, allo-ocimene, teritary amines, crystalline aluminum silicates, dicyclodiepoxy carboxylate compounds such as 3, 4-epoxy-cyclohexylmethyl-3, 4-epoxy -cyclohexane carboxylate or 3, 4-epoxy-6-methylcyclohexylmethyl 3, 4-epoxy-6-methylcyclohexane carboxylate, relatively high molecular weight (i.e. 2000 to 10,000) epoxidized polybutadienes, bis(2, 3- epoxy- cyclopentyl) ethers, epichlorohydrin-tetraphenylolalkene condensation products, 1, 2-epoxy-3-phenoxypropane, bis(3, 4-epoxy-6-methycyclohexyl methyl) adipate and mixtures thereof. However, since the nature and/or makeup of transformer oil does not materially affect the invention, any compatible low viscosity dielectric transformer oil may be utilized in the practice of the invention and all such oils we referred to herein and in the claims as transformer oils.

We claim as our invention:

1. An apparatus for crucible-free zone processing of a semiconductor rod comprising:
   an operable processing housing having a hollow gas impermeable chamber therein;
   a hollow support tube attached at one end thereof to an inner wall of said housing providing gas-impermeable access between said chamber and the exterior of said housing;
   a capacitor container attached to a second end of said support tube within said chamber, said container having a hollow fluid-impermeable chamber therein; said fluid-impermeable chamber being filled with a low viscosity dielectric cooling fluid;
   a plurality of ceramic capacitors positioned within said fluid-impermeable chamber of the capacitor container;
   a pair spaced-apart support plates mounted within said fluid-impermeable chamber and spaced from the container walls;
   said ceramic capacitor being parallelly arranged between said support plates and being electrically connected thereto;
   a first pair of hollow conduit means extending through said support tube about said capacitors and in contact with said support plates, said first pair of conduit means having one end thereof extending outside said processing housing into operational contact with an electrical current source and with a hydraulic circuit having a heat-exchange fluid flowing therein for simultaneously directing said electrical current and said heat-exchange fluid to said ceramic capacitors;
   a second pair of hollow conduit means having one end extending out from said fluid-impermeable chamber of the capacitor container and having the other end operationally connected to a second end of said first pair of hollow conduit means; and
   an annular induction heating coil having a fluid passage therein, said fluid passage being serially connected to the second end of said second pair of hollow conduit means.

2. In a device for the crucible-free zone melting of a semiconductor rod including a housing having a melting chamber, an annular induction being coil positioned within said melting chamber so as to encompass an annular zone of a semiconductor rod mounted within said chamber and which coil upon activation produces an annular melt zone of such rod, and a heating circuit operationally connecting said induction heating coil with a power source so that said circuit comprises the induction heating coil and a parallelly connected capacitance which is coupled via electrical conduits to an outlet circuit of a high frequency generator, the improvement comprising wherein:
said capacitance is formed by a plurality of parallelly connected ceramic capacitors arranged within a fluid impermeable container filled with a low viscosity dielectric cooling fluid; and
a hollow support tube within said melting chamber for supporting said fluid impermeable container at a desired location within said melting chamber and being in communication with said cooling fluid within said container;
said electrical conduits comprising hollow tubes positioned within said support tube for simultaneously guiding electrical current and a heat-exchange fluid to at least said capacitors from source of electric current and heat-exchange fluid outside and melting chamber.

3. In a device for the crucible-free zone melting of a semiconductor rod including a housing having a melting chamber, an annular induction heating coil positioned within said melting chamber so as to encompass an annular zone of a semiconductor rod mounted within said chamber and which coil upon activation produces an annular melt zone of such rod, and a heating circuit operationally connecting said induction heating coil with a power source so that said circuit comprises the induction heating coil and a parallelly connected capacitance which is coupled via electrical conduits to an outlet circuit of a high frequency generator, the improvement comprising wherein:
said capacitance is formed by a plurality of parallelly connected ceramic capacitors arranged within a fluid impermeable container filled with low viscosity dielectric cooling fluid; and
a hollow support tube clad with a coating of a highly conductive non-magnetic material and which is located within said melting chamber for supporting said fluid impermeable container at a desired location within said melting chamber and being in communication with said cooling fluid within said container;
said electrical conduits comprising hollow tubes positioned within said support for simultaneously guiding electrical current and a heat-exchange fluid to at least said capacitors from a source of electrical current and heat-exchange fluid outside said melting chamber.

* * * * *